United States Patent [19]

Cooper et al.

[11] Patent Number: 4,949,029

[45] Date of Patent: Aug. 14, 1990

[54] ADJUSTMENT CIRCUIT AND METHOD FOR SOLID-STATE ELECTRICITY METER

[75] Inventors: David M. Cooper, Duluth; Ferrokh Khandaghabadi, Norcross, both of Ga.

[73] Assignee: Schulmberger Industries, Inc., Norcross, Ga.

[21] Appl. No.: 220,121

[22] Filed: Jul. 15, 1988

[51] Int. Cl.$^5$ .................. G01R 1/38; G01R 35/00; G01C 25/00

[52] U.S. Cl. .................. 324/74; 324/130; 364/571.04

[58] Field of Search ........... 324/74, 130, 73 R, 158 R, 324/142; 364/571

[56] References Cited

U.S. PATENT DOCUMENTS

| | | | |
|---|---|---|---|
| 3,019,395 | 1/1962 | Hearn | 324/130 |
| 3,409,829 | 11/1968 | Elmore et al. | |
| 3,725,784 | 4/1973 | Bayer | |
| 3,784,912 | 1/1974 | Van Aken | 324/130 |
| 3,934,197 | 1/1976 | Pettersen et al. | 324/130 |
| 4,088,951 | 5/1978 | Fletcher et al. | |
| 4,200,933 | 4/1980 | Nickel et al. | |
| 4,335,349 | 6/1982 | Baldock et al. | |
| 4,337,517 | 6/1982 | Nickel et al. | |
| 4,494,212 | 1/1985 | Muellner | |
| 4,535,854 | 8/1985 | Gard et al. | |
| 4,541,065 | 9/1985 | Faulkner et al. | |
| 4,553,091 | 11/1985 | Bristol | |
| 4,667,153 | 5/1987 | Doyle | 324/130 |
| 4,700,128 | 10/1987 | Levonius, Jr. | |
| 4,774,457 | 9/1988 | Dunn et al. | 324/142 |
| 4,788,620 | 11/1988 | Scott | 324/130 |

Primary Examiner—Ernest F. Karlsen
Attorney, Agent, or Firm—Sanford J. Asman

[57] ABSTRACT

A calibration circuit for a solid state electricity meter comprises a plurality of resistors formed on an integrated circuit. The resistors are connected by an on-chip array of electrically controlled switches, such as MOSFETs, to signal processing circuitry driving the meter. The resistors establish variable voltage divider networks which compensate the meter for phase, gain and offset errors distributed in the signal processing circuitry. The values of the variable voltage divider network may be established automatically during testing of the meter, by a digital computer, or semi-automatically, by a technician, to establish the "on" and "off" states of the various transistors of the array.

32 Claims, 13 Drawing Sheets

| | |
|---|---|
| 0 | PHASE A GAIN ADJ (LSB) |
| 1 | " |
| 2 | " |
| 3 | " |
| 4 | " |
| 5 | PHASE A GAIN ADJ (MSB) |
| 6 | PHASE A PHASE ADJ (LSB) |
| 7 | " |
| 8 | " |
| 9 | PHASE A PHASE ADJ (MSB) |
| 10 | PHASE B GAIN ADJ (LSB) |
| 11 | " |
| 12 | " |
| 13 | " |
| 14 | " |
| 15 | PHASE B GAIN ADJ (MSB) |
| 16 | PHASE B PHASE ADJ (LSB) |
| 17 | " |
| 18 | " |
| 19 | PHASE B PHASE ADJ (MSB) |

| | |
|---|---|
| 20 | PHASE C GAIN ADJ (LSB) |
| 21 | " |
| 22 | " |
| 23 | " |
| 24 | " |
| 25 | PHASE C GAIN ADJ (MSB) |
| 26 | PHASE C PHASE ADJ (LSB) |
| 27 | " |
| 28 | " |
| 29 | PHASE C PHASE ADJ (MSB) |
| 30 | OFFSET ADJ (LSB) |
| 31 | " |
| 32 | " |
| 33 | " |
| 34 | OFFSET ADJ (MSB) |
| 35 | OVERALL GAIN ADJ (LSB) |
| 36 | " |
| 37 | " |
| 38 | " |
| 39 | " |
| 40 | " |
| 41 | OVERALL GAIN ADJ (MSB) |
| 42 | DETENT |

*FIG. 9*

(READING THE CALIBRATION LINES)

(LOADING THE SHIFT REGISTER)

ADJUSTMENT CIRCUIT AND METHOD FOR SOLID-STATE ELECTRICITY METER

TECHNICAL FIELD

The present invention is related generally to a method of and circuitry for adjusting the calibration of electrical measurement meters, and more particularly, to a method of and integrated circuit for automated or semi-automated calibration of solid-state meters for measuring electrical energy usage parameters.

BACKGROUND ART

Electricity meters are commonly used by electrical utilities to measure, for example, electrical power flowing between a commercial power source and customer loads. Within each meter of present electromechanical design, there is a disk which is magnetically coupled to the power line voltages and currents being monitored. The disk rotates at a speed proportional to power flowing through the line and meter. To initially conform the meter to utility standards, and to correct the meter as a result of drift that tends to occur over time, the meter must be initially, and thereafter from time to time, calibrated.

An electromechanical polyphase meter has up to eight adjustments for calibration, including mechanical adjustments of screws which alter the positions of magnets and other mechanisms that, together with an electromagnetic field produced by the measured electricity, drive the disk at a particular speed of rotation for a given power load. The adjustments are made initially at the factory, then, if necessary, by the customer (i.e., the utility company) to meet utility standards and, thereafter, from time to time, to compensate the meter for drift. Adjustment usually is carried out manually, although automatic calibration systems with servo-driven screw adjusters have been implemented in factories.

Recently developed solid state meters, some of which are microprocessor controlled, currently becoming adopted by the electrical utilities, have the capability of carrying out various measurement functions within a single meter at higher levels of accuracy than previously realized using electromechanical meters. Solid state electricity meters are based upon several different signal processing techniques for determining energy usage parameters, such as line power, as a function of measured voltage and current, and there are a number of different manufacturer design approaches, although the industry is moving in the direction of standardization. For a survey of solid state electricity metering systems, attention is directed to an article entitled "Solid-State Metering", by Gorzelnik, in *Electrical World*, March, 1988, pp. 47–52.

In any type of solid state electricity meter, three parameters that may be available to the utility for adjustment are gain, offset, and phase. For example, in a meter of a type having line current and voltage sensors for obtaining line current and voltage measurements on each phase and a multiplier for multiplying the pairs of voltage and current measurements together taking into account the phase angle between them to obtain energy usage parameters, gain adjustments are needed on either the voltage or current signals of each voltage/current pair to equalize (balance) meter measurement on all system power phases. A single "overall" gain adjustment is further needed to compensate for electronic gain errors which affect all meter phase (element) inputs equally (caused particularly by initial errors in the voltage or current reference needed by any electronic power measuring device). The overall gain and element balance adjustments are commonly adjusted at a line current of 12.5 or 15 percent of full scale current, a level referred to herein as "Test Amperage". Separate resistance-capacitance network adjustments calibrate the meter phase angle response for errors in the current and voltage sensors as well as in the multiplier. A separate offset adjustment circuit supplies a small constant current or voltage to the multiplier to cancel the effect of offset errors. The offset is commonly adjusted to correct power measurement at a low current equal to ten percent of Test Amperage. Various meters have additional or fewer calibration adjustments available. The adjustment methodology used for the factory adjustment may be different from that provided to the customer utility. Some adjustment methods permit adjustment only at the factory.

Several techniques for carrying out the calibration adjustments just described include potentiometers, electromechanically switched resistor networks, and selected discrete resistors. Potentiometers are convenient to use but are difficult to automate. Even more significantly, however, the sliding contact between resistive elements and the wiper of the potentiometer tends to be unreliable. Mechanical switches, such as rotary or DIP-type switches, for switching the individual resistors of a network, are more reliable, but they are inconvenient. Also, since a large number of mechanical switch contacts must be provided to carry out calibration, the cost is high. Calibration using selected discrete resistors, although very reliable, is inconvenient, since unsoldering at least one resistor is required. Then, it is necessary to determine the value of, locate, and then install, at least one new resistor. Similarly, jumpers for interconnecting resistors are not easily installed or repositioned, since soldering and unsoldering, or some other irreversible mechanical operation, is required.

Each of the mentioned calibration techniques unfortunately increases the component count, and possibly also increases the size, of the meter. Another calibration technique which does not increase the size or complexity of the meter is laser trimming of film resistors. However, this type of calibration requires very expensive equipment for implementation and does not permit subsequent readjustment by the customer.

OBJECTS OF THE INVENTION

Accordingly, one object of the invention is to provide a new and improved method of, and system for, calibrating solid state electricity meters.

Another object of the invention is to provide easily implemented and reliable calibration of solid state electricity meters.

A further object is to provide a system for making calibration adjustments to a solid state electricity meter, without requiring soldering or unsoldering of parts.

A still further object of the invention is to provide a system for making calibration adjustments to a solid state electricity meter, wherein no moving parts, such as electrical switches or adjustment screws, are involved.

Still another object of the invention is to provide a system for electricity meter calibration that is compact and does not substantially increase the component count of the meter.

A further object of the invention is to provide a system for calibrating electricity meters that does not require costly or complex external equipment for implementation.

Another object is to provide electricity meter calibration that is able to be carried out under computer control, either automatically, or semi-automatically with the aid of a technician.

Yet another object is to provide a calibration adjustment that is not irreversible, so that recalibration of the meter may be easily performed by the factory or customer utility at any time after initial adjustment.

SUMMARY OF THE INVENTION

The present invention is an improved power measurement calibration system for an electricity meter of the type comprising signal processing circuitry for determining line energy usage parameters by making power line current and voltage measurements, and, in response, obtaining an output signal related to the energy parameters, wherein errors tend to be contained in the output signal as a result of gain, phase, and offset errors distributed within the signal processing circuitry. The present improvement comprises a plurality of interconnected resistors which are connected to a plurality of electrically controlled switches to form a variable voltage divider network. The voltage divider network has output voltage diVider values which depend on the "on" and "off" states of the switches. The invention further comprises means for obtaining a signal output from the voltage divider network which is representative of the calibration required to correct one of the errors and means for connecting the signal output from the variable voltage divider network to the signal processing circuitry for correcting one of the errors, thereby calibrating the circuitry.

The invention also includes the calibration method, for electricity meters of the type which include signal processing circuitry for obtaining line energy usage parameter measurements by making power line current and voltage measurements, and, in response, obtaining an output signal related to the energy usage parameter. In such electricity meters errors tend to be contained in the output signal as a result of gain, phase and offset errors distributed within the signal processing circuitry. In accordance with the invention, the method comprises the steps of measuring registration errors of the signal processing circuitry, estimating an amount of calibration correction required at each of a plurality of calibration circuits of the signal processing circuitry depending upon measured values of the registration errors, and controlling "on" and "off" states of the switches in accordance with the calibration correction to reduce the registration errors.

BRIEF DESCRIPTION OF THE DRAWING

In the drawing:

FIG. 9 shows the serial data protocol supplied to the multiplexer by the computer in accordance with one aspect of the invention;

DETAILED DESCRIPTION OF THE PREFERRED EMBODIMENT

Figure 1:
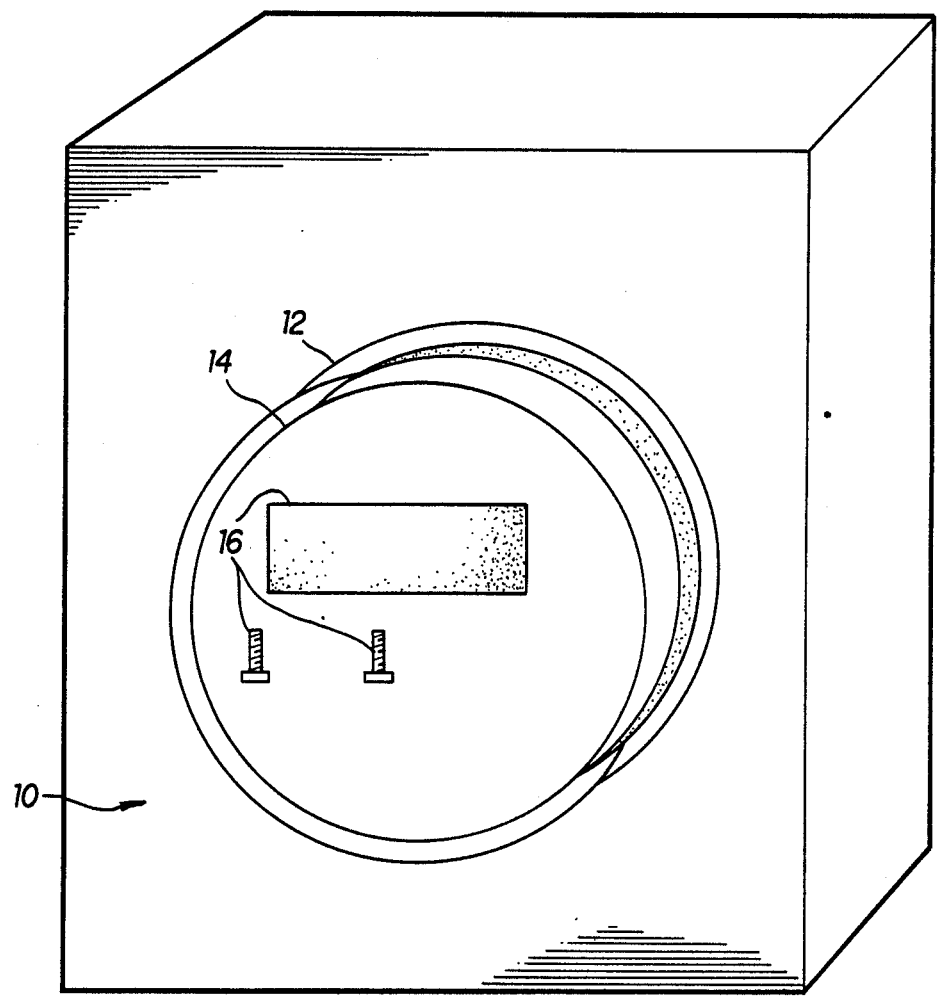
FIG. 1 is a perspective view of a solid state electricity meter of a type to be calibrated by the calibration method and system of the invention.

The foregoing and other objects of the present invention are satisfied by an adjustment, or calibration, integrated circuit (IC) which contains networks of resistors arranged into voltage divider arrays together with electrically controlled switches and operational amplifiers (op-amps) connected between the resistor networks and signal processing circuit portions of the electricity meter to be calibrated. The divider ratios of the resistor networks are determined by the "on" and "off" states of electrically controlled switches. In the preferred embodiment of the invention, the electrically controlled switches are comprised of MOS transistor switches which, in turn, are controlled by signals stored within a non-volatile memory. The stored data correspond to desired calibration gain, phase, and offset settings of the signal processing circuitry determined automatically by a computer or semi-automatically by a technician. The details of the MOS transistor switches will not be further discussed in this application, because they are merely one type of electrically controlled switch, and their design and function are readily apparent to those skilled in the relevant arts of electronic and IC design. Hereinafter, the electrically controlled switches will be referred to as "analog switches", and they will be shown schematically herein as simple mechanical switches.

Preferably, the signal processing circuitry includes voltage and current sensors coupled to the power line for obtaining current and voltage measurement signals and a multiplier for multiplying together the current and voltage measurement signals to obtain an analog energy usage parameter measurement signal. A charge-balanced voltage-to-frequency (V-F) or current-to-frequency (I-F) converter converts the analog energy usage parameter measurement signal to a digital output pulse train having a frequency proportional to the magnitude of the analog energy usage parameter measurement signal. The output pulse train is then counted by a "register" electronic assembly, since each pulse of the output power pulse train corresponds to a calibrated amount of energy in kWh.

In accordance with another aspect of the invention, a volatile shift register and associated digital logic interface a serial flow of analog switch control data between an external calibration control computer and the solid state meter's internal non-volatile memory. A multiplexer establishes a signal flow path from the controlled switches and, selectively, the shift register or the non-volatile memory. The multiplexer is controlled by a signal derived from two control signals from the computer indicating an operation mode or a test mode of the meter for applying the computer generated data either to the non-volatile memory, to control the analog switches for operation of the meter, or to the shift register, to directly control the analog switches (to facilitate high-speed testing of the calibration chip).

Meter calibration using the apparatus just described is carried out as follows: Registration errors of the signal processing circuitry are measured, and the amount of calibration correction required at each of a plurality of calibration circuits of the signal processing circuitry depending upon measured values of said registration errors is determined. The "on" and "off" states of the transistors are controlled in accordance with the calibration correction to establish variable voltage divider networks which compensate the meter for phase, gain, and offset errors distributed in the signal processing circuitry. The values of the variable voltage divider network are determined automatically by a digital computer or semi-automatically by a technician.

Referring now to FIG. 1, a solid state electricity meter 10 comprises a conventional glass or plastic electricity meter housing 12 containing a disk-shaped chassis 14 upon which is located a solid state display 16 and associated switches to control register display operation. Within the housing 12, and also inside the chassis 14, is energy usage parameter measurement and registration circuitry for driving display 16 in accordance with power consumed by the user from the lines being monitored.

Figure 2:
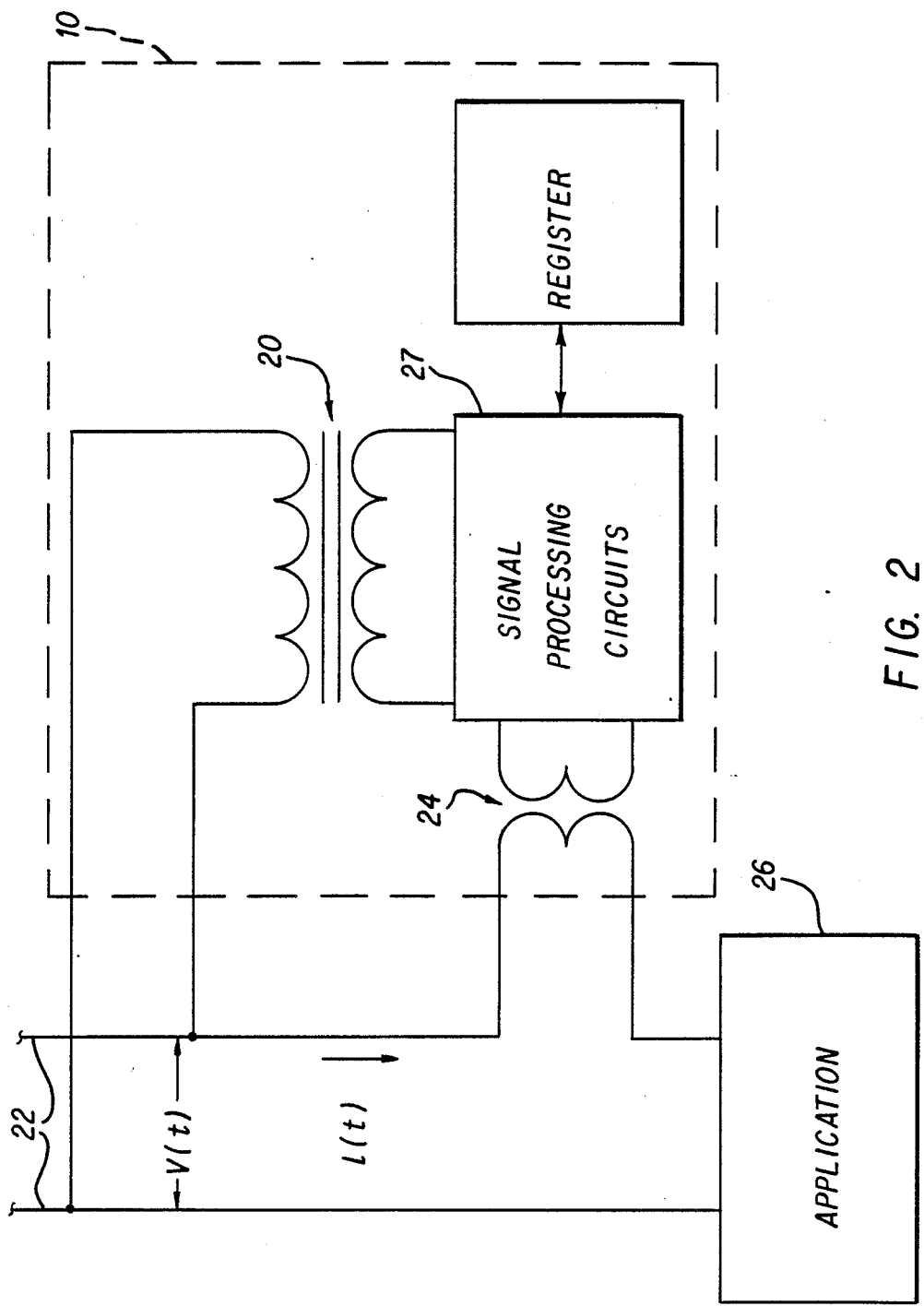
FIG. 2 is a simplified block diagram of one phase of the electricity meter coupled to a power line being monitored.

The meter 10, shown in block diagram form in FIG. 2, has a voltage sensor which may be in the form of a voltage transformer 20 as shown in the preferred embodiment of the invention. Alternatively, a resistive voltage divider (not shown) could be used. The voltage sensor 20 is connected across a pair of power lines 22 for measuring the voltage thereon. A current sensor 24, in the form of a current transformer is connected between the power lines 22 and a user application 26. The current sensor 24 is used to measure the current applied to or received from the user application 26. The user application 26 is typically the customer of a utility company, such as a residence or business, consuming electricity, or, alternatively, it may be a supplier, such as an electricity generating plant. Only a single phase of power lines 22 is shown in FIG. 2, although in practice, there may typically be multiple phases, e.g., three phases, measured by the multi-element meter 10.

Figure 3:
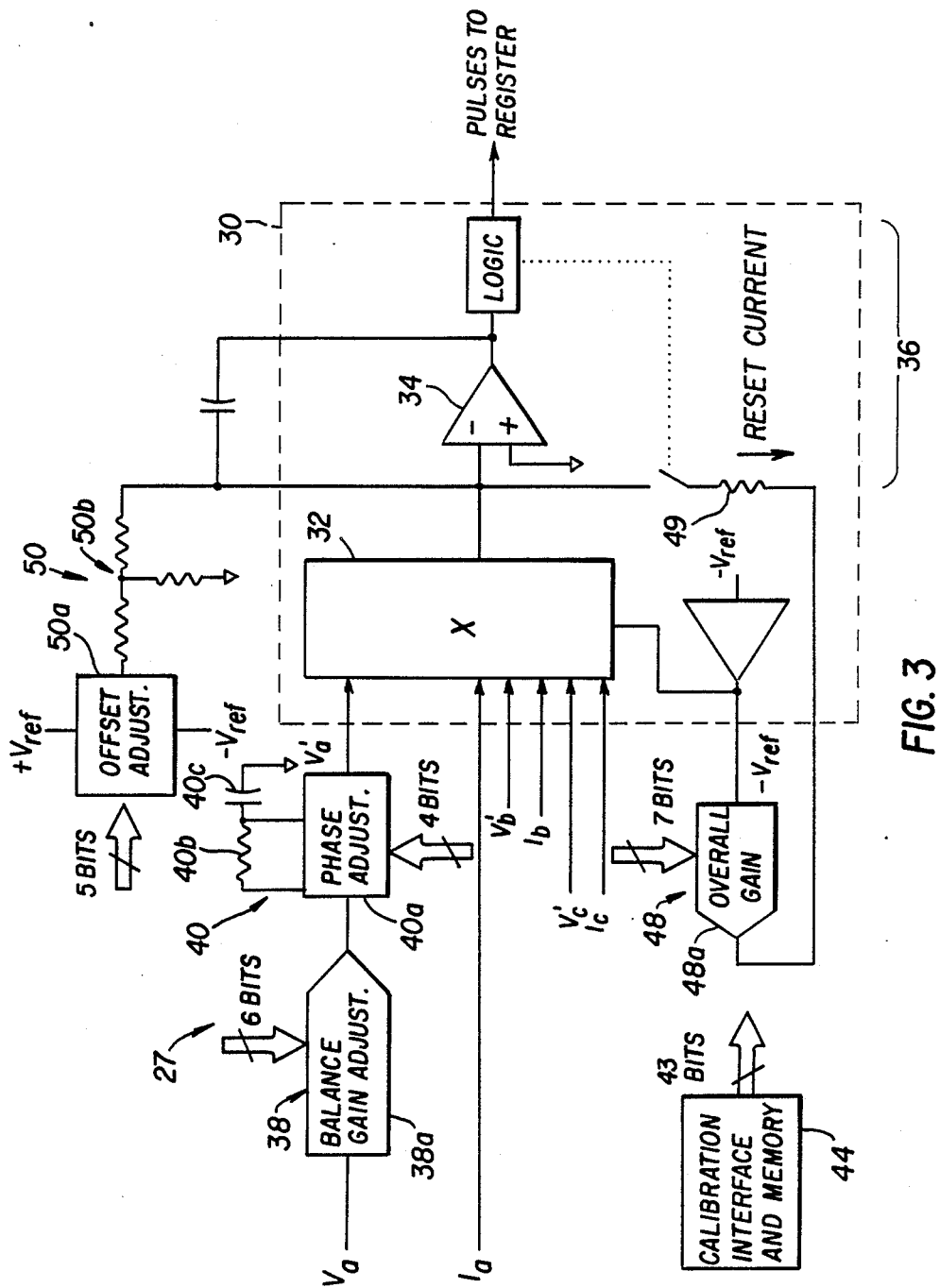
FIG. 3 is a diagram of the signal processing stages of a solid state meter, adjustable to compensate for gain, phase, and offset errors.

Inside the meter 10, the voltage sensor 20 applies a small voltage proportional to line voltage V(t) to the meter signal processing circuitry 27, detailed in FIG. 3. Similarly, current transformer 24 delivers a current proportional to line current I(t) flowing in the phase sensed. Voltage and current measurement signals, For example, $V_a'$ and $I_a$ are multiplied together within the signal processing circuitry of the meter 10 to obtain a signal having a frequency proportional to the energy usage parameter being measured.

Referring to FIG. 3, signal processing circuitry within the meter 10 comprises a multiplier assembly 30 for multiplying together the line voltage and line current measurement signals for each phase, taking into account the phase angles of the two measurements, and producing a pulse rate proportional to the line power or other energy usage parameter. In accordance with the preferred embodiment of the invention, multiplier assembly 30 comprises a signal multiplier 32 for carrying out voltage-current signal multiplications and applying a product analog signal to the inverting input of an integrator 34 which forms one stage of a charge balanced current-to-frequency converter 36. In the preferred embodiment of the invention, multiplier 32 computes the instantaneous product of each of a plurality of inputs. In the preferred embodiment of the invention, the inputs are comprised of three pairs of voltages which are each comprised of a voltage proportional to the voltage on the line being measured and a second voltage proportional to the current flowing through the line being measured. The three pairs correspond to the three phases of the power system being measured. The output of the multiplier 32 is in the form of a current proportional to the sum of the products of the input voltages. In the preferred embodiment of the invention, for each phase the multiplier 32 includes a voltage comparator which has an output which is high if the input voltage exceeds a reference signal and low if less than the reference signal. In the preferred embodiment, a triangle wave having a frequency much higher than the line frequency is used as the reference signal, so the output of the comparator is a string of pulses whose duty cycle is proportional to the input voltage. The output signal is used to control an analog switch which gates the passage of current generated by a voltage proportional to the measured current through a resistor. Thus, the output of the multiplier 32 is a current waveform whose duty cycle is proportional to line voltage and whose peak magnitude is proportional to the measured line current. The long term average of the output current waveform is a current which is proportional to the sum of the products of the various voltage-current pairs being monitored. Other details of the multiplier assembly 30, being generally known, are not described herein, for brevity. However, a suitable multiplier assembly of a type with which the invention herein may be applied is described in copending U.S. patent application Ser. No. 066,793 entitled AMPLIFIER FOR VOLTAGE OR CURRENT TO FREQUENCY CONVERTER, Ser. No. 066,794 entitled INTEGRATED POLY-PHASE POWER METER, and Ser. No. 066,795 entitled TRIANGLE WAVEFORM GENERATOR FOR PULSE-WIDTH AMPLITUDE MULTIPLIER, all of which were filed on June 25, 1987 by Robert A. Leydier and are assigned to the assignee of the present invention. The contents of the foregoing applications are incorporated herein by reference.

However, inherent in the multiplier assembly 30 are gain errors that create imbalances between the phases measured, and there also are phase errors that take place in voltage and current sensors 20 and 24 as well as in the multiplier 30 itself. In addition, the multiplier 30 uses a voltage reference source $-V_{ref}$ to establish an "overall" gain of the multiplier, i.e., one having a magnitude that affects all meter elements (phases) equally. Furthermore, the components of multiplier 30 contain offset errors that tend to induce errors into the measurements, particularly at low line currents.

To carry out element gain compensation or adjustment of multiplier assembly 30, balance control unit 38, one for each meter phase, interfaces the line voltage input terminals (such as $V_a'$) of multiplier 32 with the corresponding line voltage sensors 20, to amplitude scale the line voltage measurement for each phase. The balance control unit 38 is formed of a controlled variable resistive divider 38a, op-amp 52, and fixed resistors 54 and 56, to be hereinafter described in detail (See FIG. 5). In addition, associated with each phase, and connected between the output of balance control 38 and multiplier 32 is a phase control unit 40 comprising another controlled variable resistive divider 40a in a circuit with fixed resistor and capacitor 40b, 40c, to adjust the phase angle of the line voltage measurement signal at each phase of the power line. Accordingly, both the amplitude and phase angle of each line voltage measurement signal are adjustable, for each phase of the line, by adjusting for each phase the tap point resistances of resistive dividers 38a and 40a.

Similarly, the overall gain of multiplier assembly 30 is controlled by a gain control 48 in the form of a variable resistive divider 48a and a buffer amplifier that interconnect multiplier unit 32 with the reference voltage source $-V_{ref}$. In the preferred embodiment of the invention, gain is adjusted by controlling the magnitude of a reset current applied to integrator 34 in accordance with the methodology described in the copending patent applications identified above. Offset, inherent in the integrator 34, is likewise compensated by offset adjustment circuit 50 formed of variable resistive divider 50a interconnecting the reference voltage source, $-V_{ref}$, an inverted version of $-V_{ref}$, i.e., $+V_{ref}$, and a resistive "T" network 50b connected to the inverting input terminal of the integrator 34. The variable resistive divider circuit 50a accordingly controls the magnitude of offset compensating current applied to the integrator 34, to cancel offset inherent therein as a result of internal component imbalances and the like.

Figure 4:
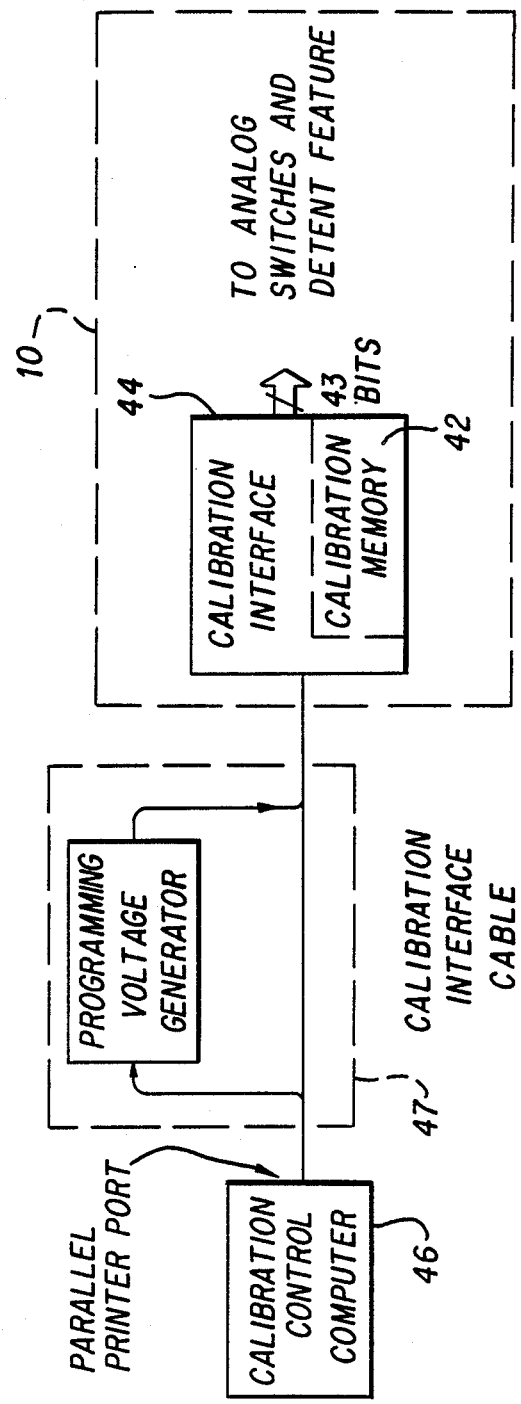
FIG. 4 is a more detailed diagram of the calibration control chip of FIG. 3 and its connections to the external computer.

Each of the variable resistive dividers, 38a, 40a, 48a, and 50a, in accordance with the invention, is comprised of an array of polysilicon resistors, formed on a common integrated circuit chip, and arranged into variable voltage divider resistance strings whose divider ratio is determined by the "on" and "off" states of controlled analog switches also provided on the IC. The states of the analog switches are controlled in turn by data stored in a non-volatile memory 42, to be described in detail hereinafter. The content of the non-volatile memory 42 is established by an adjustment interface 44 which in turn is controlled by an external computer 46 (see FIG. 4) in an automatic calibration mode of operation or by a technician in a semi-automatic calibration mode, as is also to be described in detail hereinafter. Since the memory 42 is non-volatile, the adjustments are stored therein even when power is removed from the meter 10, to be automatically available for use when power is re-applied.

An adjustment interface cable 47 is used to connect the parallel printer output port of the calibration control computer 46 to the adjustment interface 44 of the solid state meter 10. Because the adjustment interface 44 implements a simple serial interface protocol described in FIGS. 11A-11C in order to reduce interface logic requirements in the adjustment IC, and the calibration control computer printer port normally provides a bit-serial byte-parallel protocol, special computer control software is required to manipulate the adjustment interface signals in the required manner. The writing of such software is straightforward to persons skilled in such arts and is therefore not discussed in detail herein.

While one major function of the adjustment interface cable 47 is to connect the computer port data lines to the proper adjustment interface signals, another function is generation of an EEPROM programming voltage of the required magnitude and timing for use in programming the non-volatile memory of the adjustment IC. The placement of the programming voltage generator in the cable saves individual solid state meter cost and provides some security against unauthorized re-programming in the field. The required programming voltage characteristics are shown in FIG. 11C.

Figure 5:
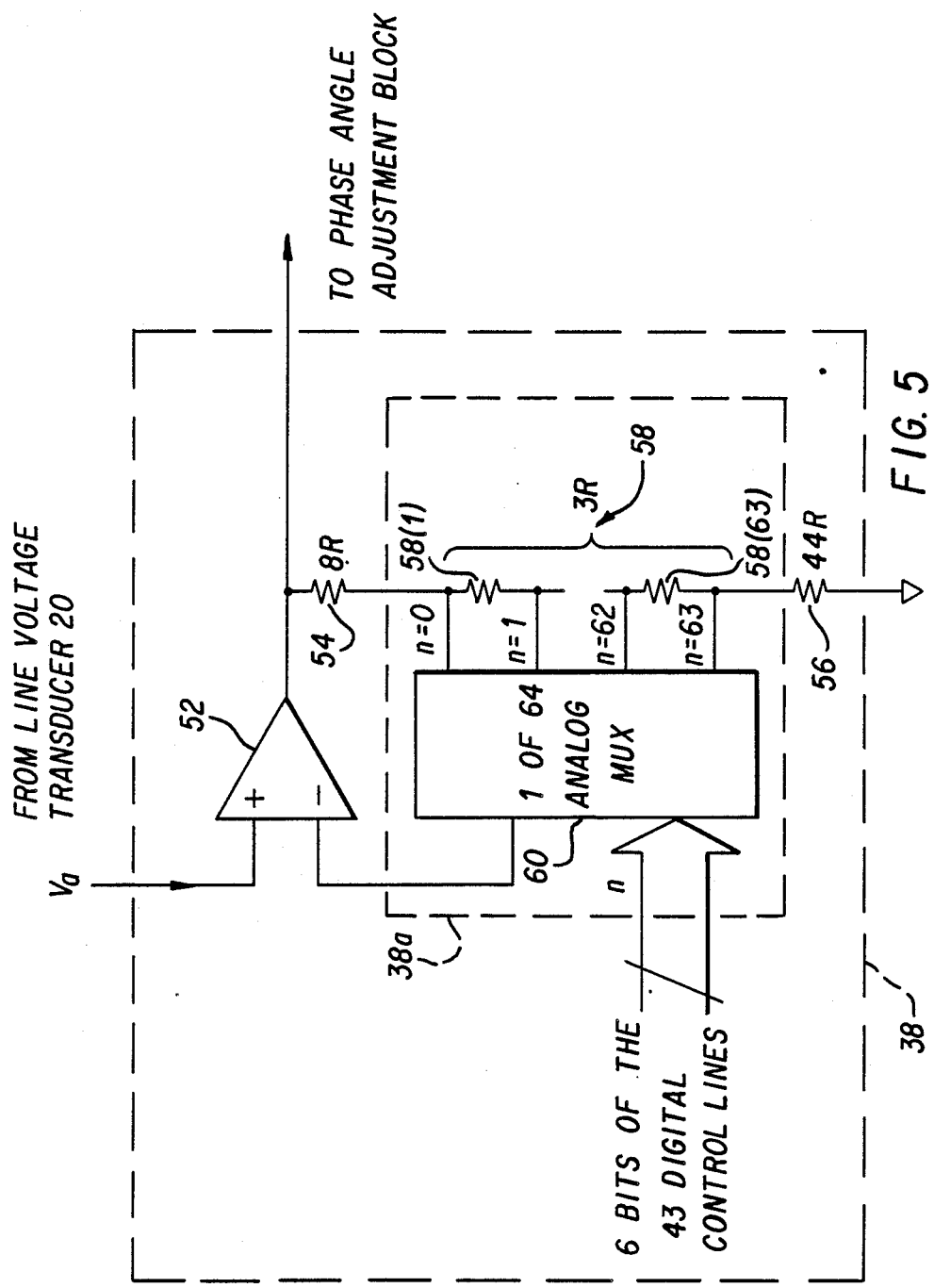
FIG. 5 is a detailed schematic of calibration circuitry for making individual phase gain (balance) adjustments of the meter in accordance with the principles of the invention.
Figure 5A:
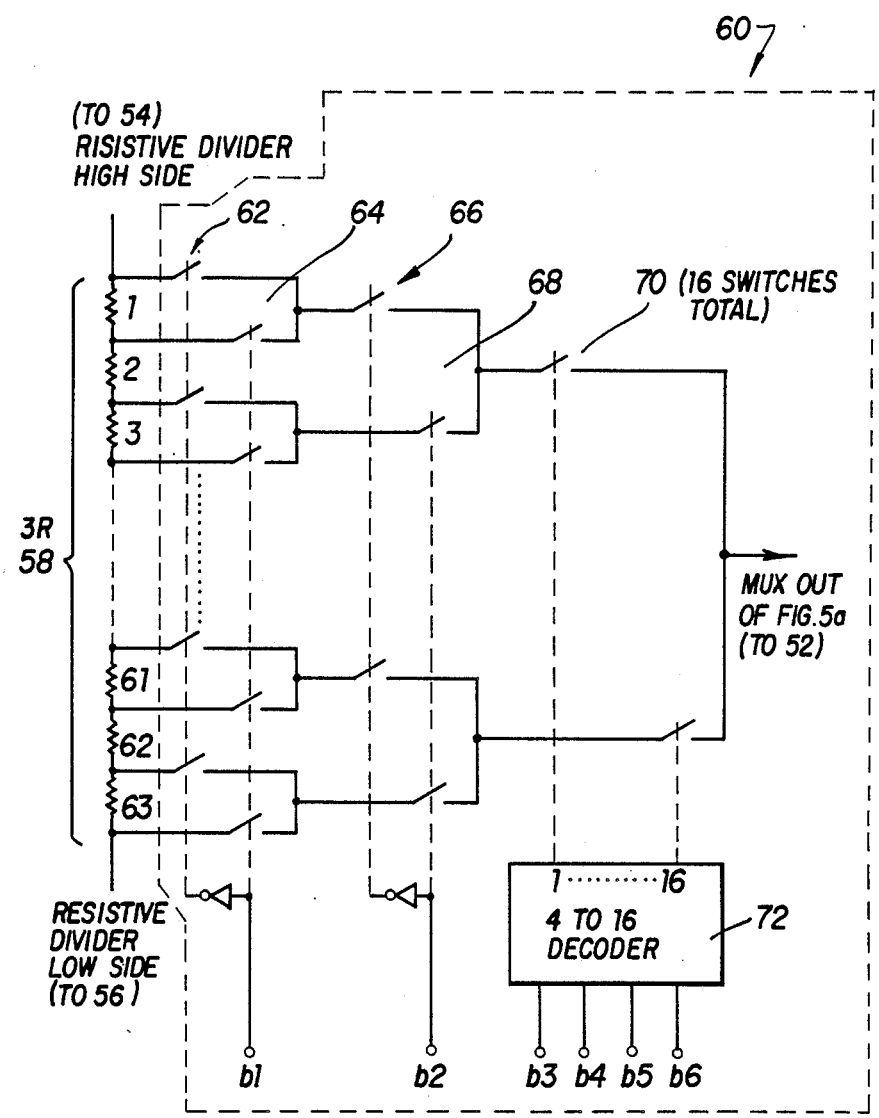
FIG. 5A is a detailed sohematic of the voltage divider comprised of the resistor string and the 1-of-64 MUX shown in FIG. 5.

With reference now to FIGS. 5 and 5A, implementation of the variable resistive divider and op-amp circuit 38a is shown in detail. The output of line voltage transducer 20 is fed to the non-inverting input of op-amp 52. Op-amp 52, together with fixed resistors 54, 56, and the voltage divider formed by the combination of resistor string 58 and 1-of-64 MUX 60 form a non-inverting gain amplifier, the gain of which depends on the setting of the 1-of-64 MUX 60. The 1-of-64 MUX 60 controls the circuit gain by connecting the MUX output (and the inverting input of op-amp 52) to one of the 64 nodes of the linear resistor string 58.

The function of the 1-of-64 MUX is shown in more detail in FIG. 5A. Voltage divider 58 is a string of 63 integrated polysilicon resistors having a total of 64 interconnecting nodes, including the end points, and a total resistance 3 times some basic resistance value denoted as "R". The connection of the divider output to individual resistor nodes is accomplished through three stages of analog switch pairs. Stage one comprises thirty-two pairs of switches 62, 64. Stage two comprises sixteen pairs of switches 66, 68, and stage three comprises sixteen switches 70.

The least significant switch control bit (LSB) b1 causes all switches 62 to be closed when true (high), and all switches 64 to be open. Conduction paths to every other node of resistor 58 are thus formed, beginning at the very top of resistor 58 if b1=false (low), or beginning at the first node down from the top if b1=true (high). The number of possible conduction paths is thus reduced from the number of resistor nodes (64 total) to 32.

In a similar manner, the state of bit b2 controls the states of switch pairs 66 and 68, reducing the possible conduction paths from 32 to 16.

Finally, the 16 conduction paths from switch pairs 66 and 68 are selected down to only one by sixteen switches (70) controlled by a 4-line-to-16-line decoder 72. Bits b3 through b6 comprise the upper four bits of the 1-of-64 MUX six-bit gain control word.

It may thus be seen that resistors 58 and the associated analog MUX form a programmable divider whose equivalent "wiper" is at the top when the programming input is binary 0 and at the very bottom when the programming input is binary 63 (all 1's).

Referring again to FIG. 5, note that fixed resistors 54 and 56 have values of 8 times and 44 times the basic resistor value "R" described previously. Given the operation of the 1-of-64 MUX 60 described previously, the gain of the total balance adjustment block is:

$$\frac{55}{47 - (n/21)} \text{ V/V}$$

ranging from 1.170 at n=0 to 1.250 at n=63 (where n corresponds to the node number, 0..63). The average gain change for one LSB change in n is thus chosen to be 0.105 percent. The resolution of utility meter test systems, and thus the desired minimum adjustment resolution of a solid state meter, is approximately 0.1 percent.

Figure 6:
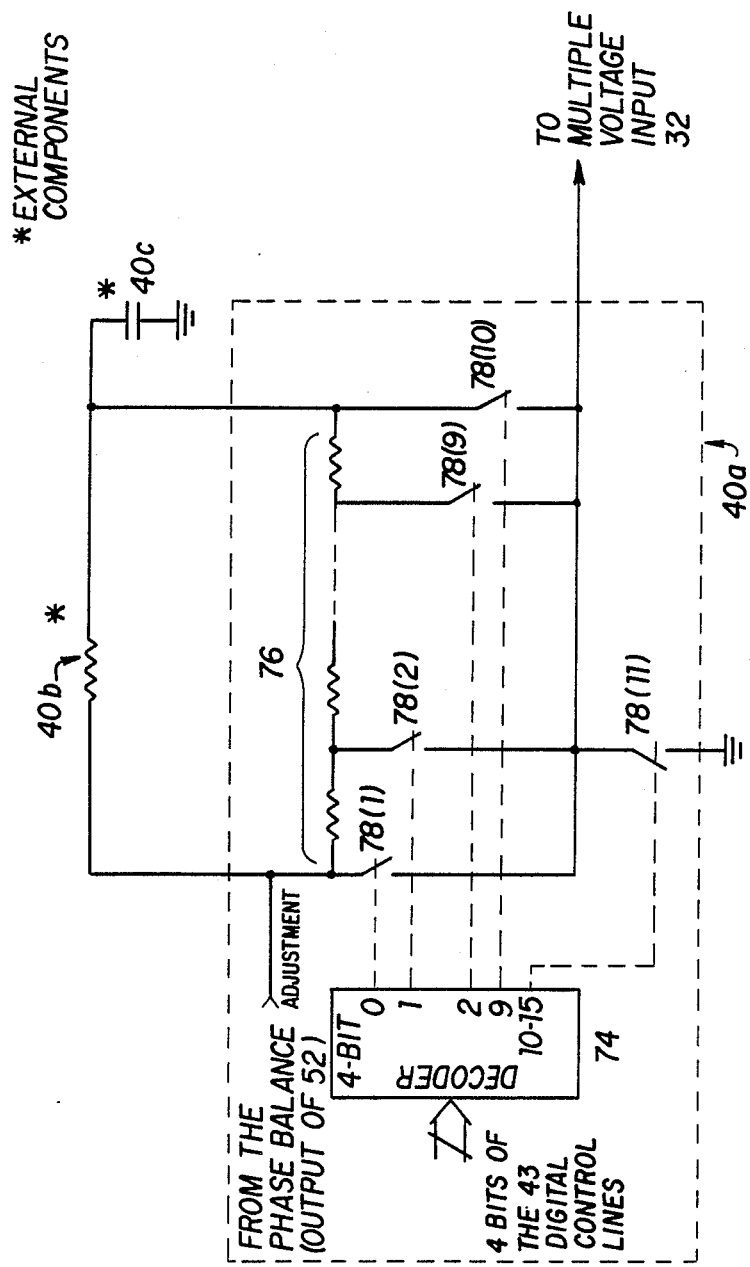
FIG. 6 is a detailed diagram of phase angle adjustment circuitry in accordance with the invention.

The detailed implementation of phase adjustment block 40a is shown in FIG. 6. A fixed total amount of phase delay is achieved by the parallel combination of IC resistor string 76 and external resistor 40b, together with external capacitor 40c. The total value of resistors 76 is chosen to be at least ten times greater than the value of resistor 40b, so that the total phase delay is mostly determined by the more stable external components 40b, 40c. This architecture is provided to make the circuit phase delay relatively immune to the large initial tolerance and high temperature coefficient associated with the IC polysilicon resistors 76.

The output of the phase adjustment block 40a, which drives the multiplier voltage input 32, is connected to one of the ten nodes of resistor string 76 by a series of ten analog switches 78(1)–78(10). Only one of the switches 78(1)–78(10) is closed at a time. The particular switch which is closed is controlled by four bits from the adjustment interface and memory circuits described in more detail later, via a 4-bit to 16-line decoder 74. An additional switch 78(11) is provided to ground the IC voltage output for meters which monitor less than three power system phases.

The achievable phase delay through this circuit thus varies from nearly 0 when switch 78(1) is closed to the maximum when switch 78(11) is closed. The maximum phase delay can be approximated by:

$$\text{Phase Delay (max)} = \frac{\text{Arctan}(2*PI*f*R_{total}*C)}{PI} *180*60 \text{ minutes}$$

where "$R_{total}$" is the parallel combination of the external resistor 40b and the total internal resistor 76, "C" is the external capacitor 40c, and "f" is the power line frequency of interest.

The total achievable phase delay can be varied over a wide range by choosing the values of external components 40b, 40c. The number of adjustment increments remains fixed at the number of internal resistors 76, so that a balance must be struck between adjustment range and adjustment resolution. An adjustment increment near 2 minutes per step is convenient, since this value yields a power registration adjustment resolution near 0.1 percent at Test Amperage and a line power factor of 0.5.

Figure 7:
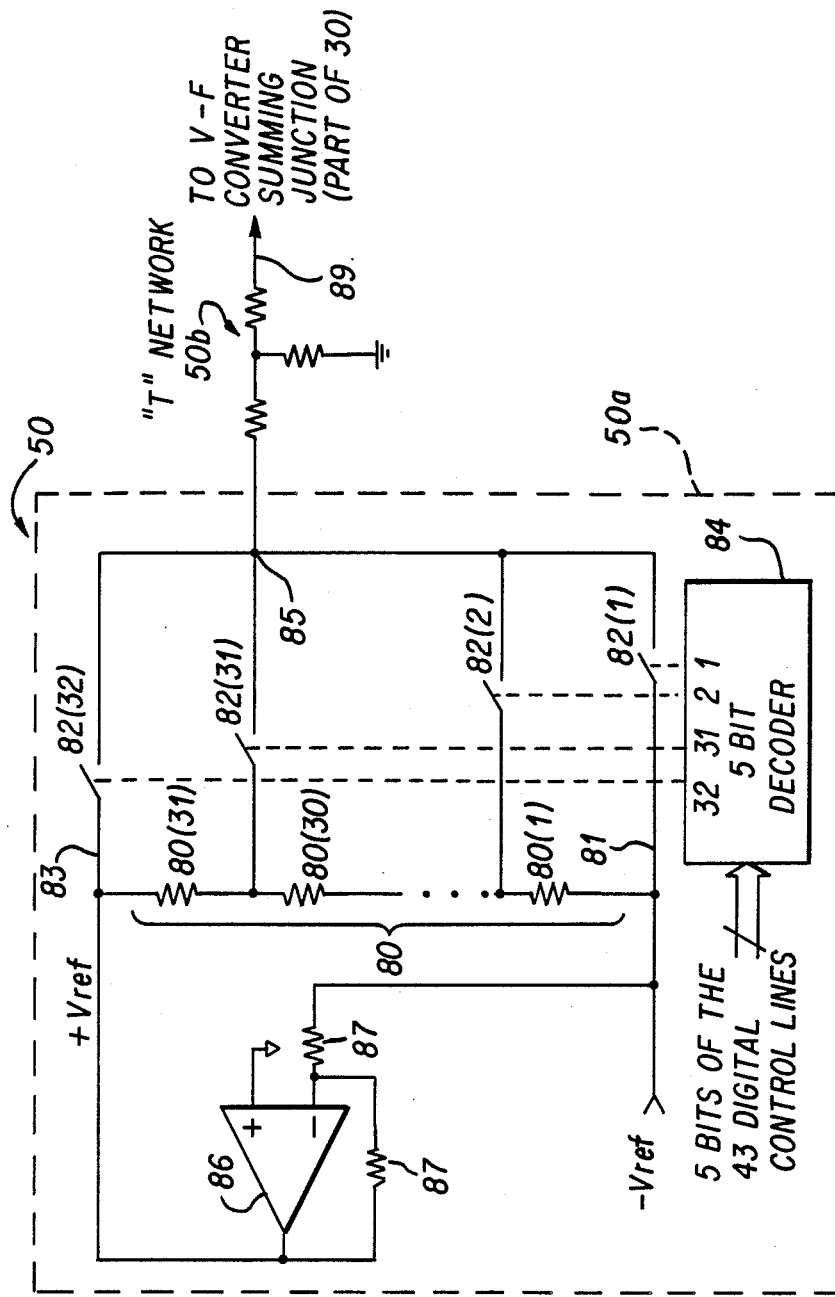
FIG. 7 is a detailed diagram of the offset adjustment circuit used in the preferred embodiment of the invention.

The design of the offset adjustment circuit 50 is detailed in FIG. 7. The offset adjustment circuit generates a programmable output voltage ranging from $-V_{ref}$ to $+V_{ref}$ which is converted to an offset correction current by a "T" network made up of resistors 50b outside the variable resistive divider circuit 50a.

The negative reference voltage, $-V_{ref}$, is available directly from the meter multiplier circuits discussed previously. However, because a symmetrical bipolar output voltage range is desirable, a positive reference voltage, $+V_{ref}$, is generated using op-amp 86 and associated matched feedback resistors 87. Op-amp 86 is therefore configured for unity inverting gain.

A string of 31 equal polysilicon resistors (80(1) through 80(31)) is connected between the positive and negative reference voltages, $+V_{ref}$ and $-V_{ref}$. Thirty-two analog switches 82, controlled by a 5-bit-to-32-line decoder 84, cause one of the switches 82 to be closed at a time, depending upon the value of the bits to the decoder 84 received from the adjustment interface 44 and the non-volatile memory 42. The decoder 84 is connected so that the switch 82(1) at the most negative resistor node 81 is closed when the programming input is 0, and the switch 82(32) at the most positive node 83 is closed when the programming input is binary 31 (all 1's, i.e., '11111').

It may be seen that, if the load impedance imposed by the "T" network 50b is much greater than the impedance of the resistors 80, the output voltage at the junction point 85 of the analog switches 80 is:

$$V_{out} = (-V_{ref}) + n \frac{(+V_{ref} - (-V_{ref}))}{31}$$

In a manner similar to that of the phase adjustment block 40a, the total offset adjustment current range at the output 89 of "T" network 50b is selectable by varying the design of the "T" network, but the number of adjustment increments is fixed at the number of resistors 80, i.e., there will be a number of possible adjustment settings which is one greater than the number of resistors 80. Again, it is desirable to choose an offset adjustment current increment (the current which comes out of node 89) that yields a power meter registration increment near 0.1% at ten percent of Test Amperage.

Figure 8:
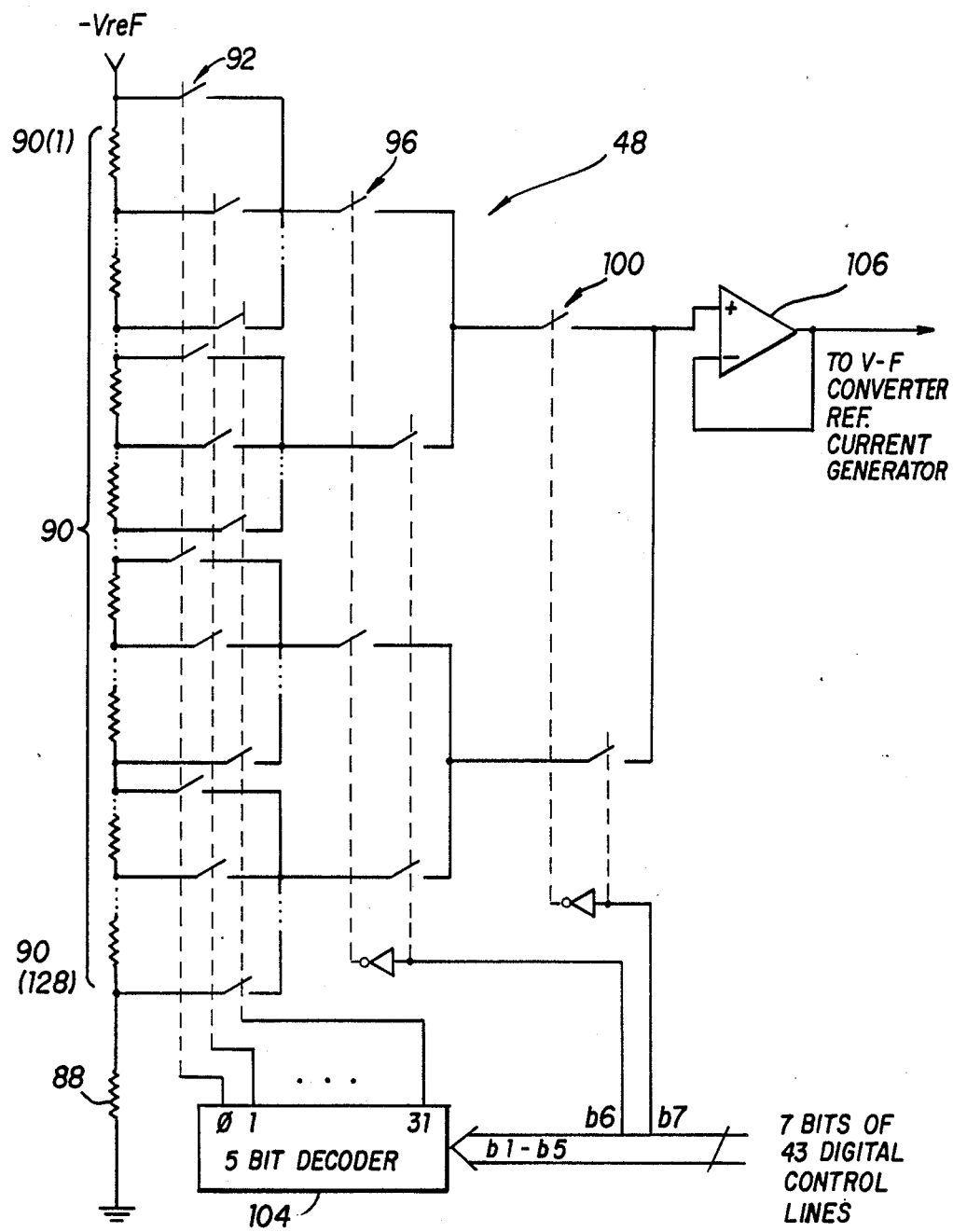
FIG. 8 is a detailed diagram of gain adjustment circuitry in accordance with the invention.

In FIG. 8, the design of the gain control 48, which is used to control the overall gain of multiplier assembly 30 by generating an adjustable reset current through resistor 49 (see FIG. 3), is detailed. The transfer function of multiplier assembly 30, i.e., the number of pulses out as a function of energy parameter (kVA or VARs) on lines 22, is inversely proportional to the reset current. Thus the transfer function is also inversely proportional to $-V_{ref}$. The negative reference voltage, $-V_{ref}$, is applied to a resistive divider formed by resistor string 90, made up of resistors 90(1) 90(128), and fixed resistor 88. The relative sizes of these resistors 88, 90 are chosen so that the divider gain can be varied from unity ("wiper" at the top of the divider) to 0.855 ("wiper" at the junction of resistors 88 and 90).

The connection of the divider output "wiper" (the non-inverting input of op-amp 106) is determined by three stages 92, 96, 100 of analog switches. In the first stage 92, the switches are grouped in four groups of thirty-two switches per group. In the second and third stages 96, 100, the switches are grouped in pairs. The four groups of switches in the first stage 92 are controlled by a 5-bit-to-32-line decoder 104, which is driven by the lowest 5 bits of address information received from the adjustment interface 44. After the first stage 92 of switches, the number of conductive paths is reduced from 128 to 4. The upper two bits b6, b7 drive the last two stages 96, 100 of switches directly and select one of the four paths. The result is that, at n=0 the divider output "wiper" is connected to the resistor node nearest $-V_{ref}$ and gain is unity. At n=127, the divider output "wiper" is connected to the junction of resistors 88 and 90(128), yielding the lowest circuit gain. The inverse relationship of programming input and circuit gain is chosen to yield a direct relationship between meter registration and programming input, because $-V_{ref}$ is in the denominator of the multiplier gain transfer function.

Because a significant transient load is placed on the overall gain circuit output by the reset circuitry of the I-F converter 36, a unity gain buffer comprised of op-amp 106 is used to buffer the resistive divider output. The offset voltage and transient response characteristics of this op-amp 106 are particularly critical in this application, but are readily solvable by persons skilled in the art of IC op-amp design.

Preferably, the analog switch control logic of 1-of-64 MUX 60, variable resistive divider 40a, variable resistive divider 50a, and gain control 48 in FIGS. 3 and 5–8 are formed on the adjustment IC and are accessed from the external computer 46 via data in bit-serial format supplied to non-volatile memory 42. With reference to FIG. 9, the calibration data supplied to the decoders by memory 42 are in the form of a 43 bit code having a protocol wherein the balance adjust bits for phases A, B and C, are bits 0–5, 10–15 and 20–25, respectively. The phase angle adjustment bits, shown in FIG. 6, are bits 6–9, 16–19 and 26–29, respectively. The offset adjustment bits, shown in FIG. 7, consist of bits 30–34, and the gain adjustment bits, shown in FIG. 6, consist of bits 35–41. Finally, bit 42 is a detent bit, indicating whether a "detent" logic function, which determines whether negative power flow from the customer as well as positive power flow to the customer is to be accumulated, is enabled.

Figure 10:
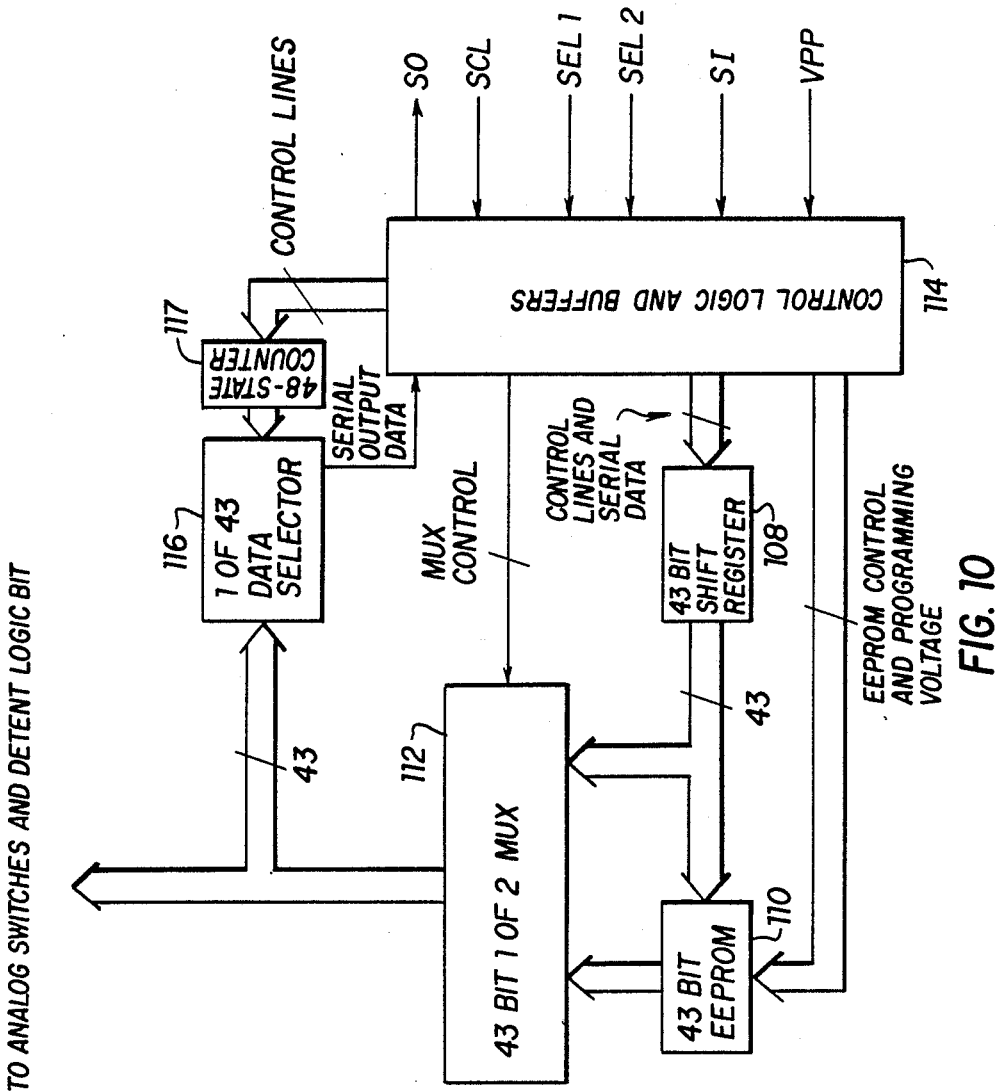
FIG. 10 is a diagram of circuitry for multiplexing serial data from a computer to a non-volatile memory or a volatile shift register for controlling divider ratio switching transistors selectively in calibration and testing modes of operation.
Figure 11A:
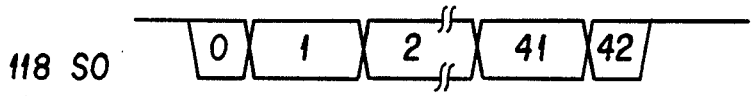
FIGS. 11A-11C show the detailed communication protocols used by an external calibration control computer to interact with the calibration circuits of a solid state meter designed in accordance with the present invention.
Figure 11A:
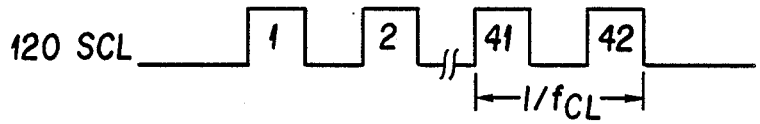
Figure 11A:
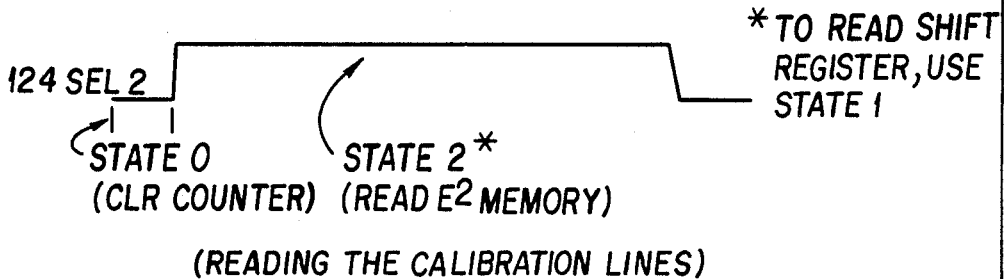
Figure 11B:
Figure 11B:
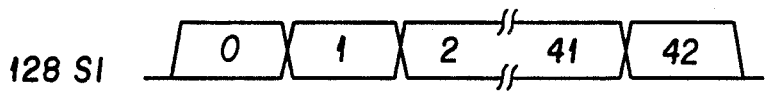
Figure 11C:
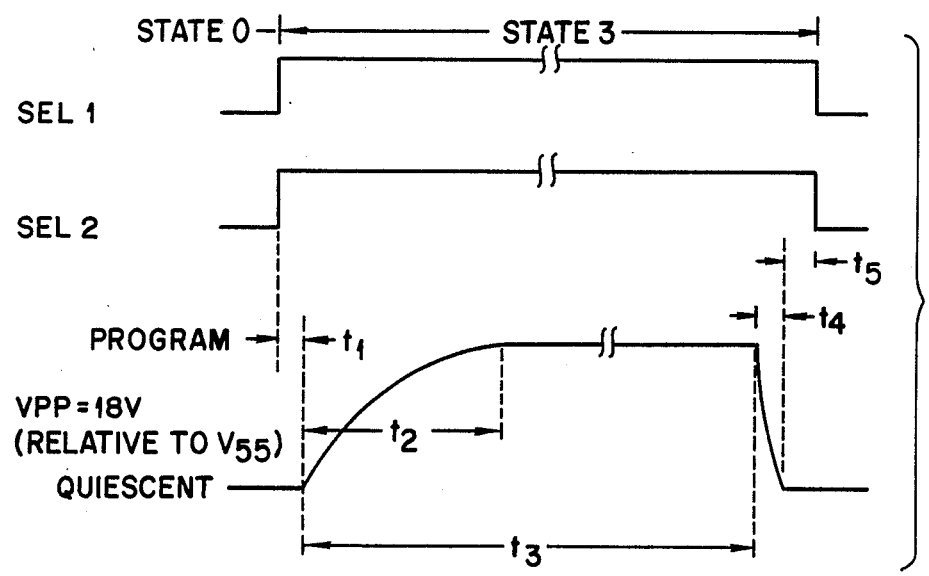

The communication protocol between the external computer 46 and the adjustment interface 44 is detailed in FIGS. 11A, 11B, and 11C. FIG. 11A illustrates the process of reading the states of the calibration control lines using the 1-of-43 data selector 116 (FIG. 10). During this process, the programming voltage ("VPP") and serial input ("SI") lines are set to 0. The two control lines "SEL1" and "SEL2" which select the particular interface operation mode are also set to 0 initially to clear the counter 118 which controls the 1-of-43 data selector 116. Control lines "SEL1" and "SEL2" are then set to 0/low and 1/high, respectively, to place the control logic in the proper mode. When the control lines are set in the proper states, the logic state corresponding to the lowest order bit (bit 0) of the 43 control lines appears on the "SO" serial output line 118. The states of the higher order bits are clocked onto the serial output line using the shift clock "SCL" line 120. The states of the successive calibration control lines are stable on the serial output line on the falling (trailing edge) of the shift clock waveform 120. In this manner, all 43 control line states can be read into the external computer, beginning with bit 0 and ending with bit 42.

FIG. 11B details the communication protocol for writing data to the shift register 108. The data may then be applied directly to the calibration control lines or used to program the EEPROM memory 110 which implements the non-volatile memory 42 of FIGS. 4 and 5. Throughout this process, the control lines "SEL1" and "SEL2" and the "VPP" programming voltage are all set to 0/low. The 43 bits of calibration data are clocked serially into the shift register 108, starting at bit 0 and ending with bit 42. All 43 bits must be shifted into the register 108. Partial loading is not permitted. The data bits are placed serially on the "SI" serial input line 128 beginning at bit 0. For each bit, the "SCL" shift clock line 126 is clocked once. The serial input data 128 must be stable before the rising edge of the shift clock 126 and continue stable until after the falling edge of shift clock. Thus, the data is changed while "SCL" is low (quiescent).

FIG. 11C details the process for writing the data from shift register 108 to non-volatile memory 110. During this process, the "SCL" and "SI" inputs must be held low. First, the "SEL1" and "SEL2" control lines are both set to 0. Then, both control lines are set high and must be held high until the programming cycle is complete and "VPP" is back to 0. After the control lines are set high, the "VPP" programming voltage is pulsed high for a time and pulse shape dependent upon the specific design art implemented in the EEPROM memory. A typical length of the programming pulse ("t3" in FIG. 11C) is 20 msec. After the programming "VPP" pulse, the control lines SEL1 and SEL2 are returned to 0, which terminates the programming cycle and returns control of the internal 43 calibration control lines to the EEPROM memory output.

The 43-bit serial data from the external computer 46 are applied to a shift register 108, shown in FIG. 10, which is a 43-bit serial-input, parallel-output register whose outputs are connected both to a 43-bit EEPROM 110, and to one input channel of a forty-three bit, one-of-two channel multiplexer 112. The other input to the multiplexer 112 is obtained from the output of the EEPROM 110. Multiplexer 112, shift register 108 and EEPROM 110 are controlled by control logic 114 in accordance with data from external computer 46 (FIG. 4) selectively to: (1) program the 43-bit data from shift register 108 into EEPROM 110; (2) transmit data from shift register 108, through multiplexer 112, to the analog switches; or (3) transmit data from EEPROM 110 through the multiplexer 112 to the analog switches.

A one-channel-to-43-channel multiplexer 116 and counter 117, which function as a parallel-to-serial converter, are provided to read the control states of the control lines back to the external computer. The multiplexer 116 is caused to connect its output to one of the 43 switch control lines by the outputs of a counter 118, that, in turn, is clocked by a signal supplied by the computer 46 and is reset in response to writing of data into the shift register 108 or EEPROM 110.

In general, the data supplied to the analog switches through the multiplexer 112 are provided by EEPROM 110, which data under the control of control logic 114 are supplied initially from the computer 46 to the volatile shift register 108 for temporary storage and then to the EEPROM. However, for testing the calibration circuit, it is preferable to supply data from shift register 108 to the switches directly, rather than from EEPROM 110, since writing data to a volatile shift register can be done much more quickly than the 20 msec. delay required to program present state of the art EEPROM memory. Furthermore, because there are a limited number of times that an EEPROM can be written into before deterioration occurs, it is preferable to carry out testing of the calibration circuit via volatile shift register 108 and not via EEPROM 110.

The adjustment IC and associated meter design permit at least three distinct classes of meter calibration procedures. In a "closed loop" fully automatic calibration mode, the external computer controls checking of the power registration performance of a meter under test (MUT) by comparing its output pulse frequency to the output of a standard meter (both meters having known loads), and further makes required calibration changes to the meter calibration switches by changing the data in adjustment IC EEPROM memory.

Calibration of a MUT can also be accomplished semi-automatically wherein a technician separately measures the performance of the MUT against that of a standard meter and types the resulting performance measurement (expressed as a percent registration number, with 100% being a fully calibrated meter) into the external computer. The external computer and software then determine the required calibration switch changes necessary to achieve 100% registration on the particular performance parameter being tested and changes the EEPROM programming accordingly.

In yet another mode of meter calibration, herein called manual mode, the technician tests meter registration as described in "semi-automatic operation", interprets the percentage registration data, determines independently EEPROM bit changes required for 100% registration, and uses the computer and software to directly set new control numbers into the EEPROM memory.

The calibration function of solid state meters such as described in this application is well behaved and deterministic. However, several of the meter calibration adjustments (element balance and overall gain, for example) interact by their very nature. It should be obvious to someone skilled in the art of metering that the calibration process, whether accomplished automatically by computer or with the aid of a technician, is at least to some extent an iterative process.

We claim:

1. An improved power measurement calibration system for an electricity meter of the type comprising signal processing circuitry for determining line energy usage parameters by making power line current and voltage measurements, and, in response, obtaining an output signal related to said energy parameters, wherein errors tend to be contained in said output signal as a result of gain, phase and offset errors distributed within said signal processing circuitry, said improvement comprising:
   memory means for storing calibration data in accordance with a calibration for correcting one of said errors in said output signal;
   a plurality of interconnected resistors;
   a plurality of electrically controlled switches responsive to said calibration data stored in said memory means and interconnected with said plurality of resistors to form a variable voltage divider network having output voltage divider values which depend on the "on" and "off" states of said switches;
   means for obtaining a signal output from said voltage divider network which is representative of the calibration represented by said calibration data; and
   means for connecting said signal output from said variable voltage divider network to said signal processing circuitry for correcting one of said errors, thereby calibrating said circuitry.

2. The calibration system of claim 1, wherein said electrically controlled switches are comprised of transistor switches.

3. The calibration system of claim 2, wherein the state of each of said transistor switches is controlled by data stored in said memory means.

4. The calibration system of claim 1, wherein said plurality of resistors are connected in series with nodes therebetween and said plurality of switches are interconnected together and to said nodes whereby there is a single output from said switches which is connected to a particular one of said nodes.

5. The calibration system of claim 4 wherein the data stored in said memory means is representative of the particular node to which said single output of said switches is to be connected.

6. The calibration system of claim 1, further comprising computer means for programming said memory means to store in said memory data representative of said calibration data corresponding to the desired calibration required to correct at least one of said errors.

7. The calibration system of claim 6, including a serial-to-parallel interface means for interfacing a serial flow of said calibration data between said computer means and said memory means.

8. The calibration system of claim 7, wherein said serial-to-parallel interface means comprises a shift register.

9. The calibration system of claim 8, including multiplexer means for establishing a signal flow path from said switch means and, selectively, one of said shift register and said memory means.

10. The calibration system of claim 9, wherein said multiplexer means comprises means responsive to a control signal indicating an operation mode or a test mode of said meter for selecting said signal flow path.

11. The calibration system of claim 8, including means for reading the output of said multiplexer means to determine the status of said electrically controlled switches.

12. The calibration system of claim 9, further comprising decoder means for interfacing said multiplexer means and said electrically controlled switches.

13. The calibration system of claim 12, wherein said decoder means includes means for decoding a data word corresponding to said calibration data having the following format:

| bit # | Contents |
|---|---|
| 0 | Phase A Bal. Adj. (LSB) |
| 1 | " |
| 2 | " |
| 3 | " |
| 4 | " |
| 5 | Phase A Bal. Adj. (MSB) |
| 6 | Phase A Phase Adj. (LSB) |
| 7 | " |
| 8 | " |
| 9 | Phase A Phase Adj. (MSB) |
| 10 | Phase B Bal. Adj. (LSB) |
| 11 | " |
| 12 | " |
| 13 | " |
| 14 | " |
| 15 | Phase B Bal. Adj. (MSB) |
| 16 | Phase B Phase Adj. (LSB) |
| 17 | " |
| 18 | " |
| 19 | Phase B Phase Adj. (MSB) |
| 20 | Phase C Bal. Adj. (LSB) |
| 21 | " |
| 22 | " |
| 23 | " |
| 24 | " |
| 25 | Phase C Bal. Adj. (MSB) |
| 26 | Phase C Phase Adj. (LSB) |
| 27 | " |
| 28 | " |

-continued

| bit # | Contents |
|---|---|
| 29 | Phase C Phase Adj. (LSB) |
| 30 | Offset Adj. (LSB) |
| 31 | " |
| 32 | " |
| 33 | " |
| 34 | Offset Adj. (MSB) |
| 35 | Gain Adj. (LSB) |
| 36 | " |
| 37 | " |
| 38 | " |
| 39 | " |
| 40 | " |
| 41 | Gain Adj. (MSB) |
| 42 | Detent |

14. The calibration system of claim 8, including command signal decoder means responsive to input command signals for selectively establishing read and write modes of operation of said shift register and said memory means.

15. The calibration system of claim 1, wherein said signal processing circuitry includes measurement means coupled to said power line for obtaining current and voltage measurement signals, multiplier means for multiplying together said current and voltage measurement signals to obtain an analog line energy parameter measurement signal, and converter means for converting said analog line energy parameter measurement signal to an output signal having a frequency related to the magnitude of said analog line energy parameter measurement signal.

16. The calibration system of claim 1, wherein said resistors are formed of polysilicon.

17. The calibration system of claim 16, wherein said plurality of interconnected resistors, said plurality of electrically controlled switches, said means for obtaining a signal output from said voltage divider network, and said means for connecting said signal output from said variable voltage divider network to said signal processing circuitry are all formed on a single monolithic integrated circuit.

18. The calibration system of claim 17, wherein said single monolithic integrated circuit includes more than one of each of said plurality of interconnected resistors, said plurality of electrically controlled switches, said means for obtaining a signal output from said voltage divider network, and said means for connecting said signal output from said variable voltage divider network to said signal processing circuitry, whereby more than one of said gain, offset, and phase errors may be simultaneously corrected by said single integrated circuit.

19. The calibration system of claim 18, wherein said single monolithic integrated circuit further comprises a non-volatile memory for storing said calibration data.

20. An improved power measurement calibration system for an electricity meter of the type comprising signal processing circuitry for determining line energy usage parameters by making power line current and voltage measurements, and in response, obtaining an output signal related to said energy parameters, wherein errors tend to be contained in said output signal as a result of phase errors distributed within said signal processing circuitry, said improvement comprising:

(a) an adjustable voltage divider network comprised of a plurality of interconnected resistors and a plurality of electrically controlled switches interconnected with said plurality of resistors to form a variable voltage divider network having an output terminal and a variable voltage divider ratio which depends on the "on" and "off" states of said switches, said adjustable voltage divider network and said switches being formed on a monolithic integrated circuit; and (b) a low pass network comprised of a resistor in series with a capacitor, the resistor of said low pass network being connected in parallel with said adjustable voltage divider network, the value of said resistor being less than the overall resistance of said voltage divider network, whereby changes in the voltage divider ratio cause the phase of voltage measured between said output terminal of said voltage divider network and the terminal of the capacitor in said low pass network which is not connected to said resistor in said low pass filter to vary in proportion to said voltage divider ratio.

21. The calibration system of claim 15, wherein said converter means includes a reference potential source and said connection means includes means for connecting one of said voltage divider networks between said reference potential source and said converter means to provide a composite gain adjustment of said signal processing circuitry.

22. For an electricity meter including signal processing circuitry for obtaining line energy usage parameter measurements by making power line current and voltage measurements, and in response, obtaining an output signal related to said usage parameter, wherein registration errors tend to be contained in said output signal as a result of gain, phase and offset errors distributed within said signal processing circuitry, said meter including a power measurement calibration apparatus comprising an integrated circuit; a plurality of resistors formed on said integrated circuit; electrically controlled switch means comprising transistors formed on said integrated circuit, said transistors interconnected with said plurality of resistors to form variable voltage divider networks depending upon respective states of said transistors; memory means formed on said integrated circuit for storing data corresponding to respective on and off states of said transistors; means for coupling control signals from said memory means to said transistors; and means for connecting said variable voltage divider networks to said signal processing circuitry, a calibration method, comprising the steps of:

measuring registration errors of said signal processing circuitry;

estimating an amount of calibration correction required at each of a plurality of calibration circuits of said signal processing circuitry depending upon measured values of said registration errors;

providing calibration data corresponding to said calibration correction to said memory means for storage therein, and controlling on and off states of said transistors in accordance with said calibration data stored in said memory means to reduce said registration errors.

23. The calibration method of claim 22, wherein said memory means comprises non-volatile memory means.

24. The calibration method of claim 22, wherein the step of providing said calibration data comprises:

providing said calibration data to said memory means from a source external to said integrated circuit; and thereafter enabling said memory means to provide said control signals to said transistors.

25. The calibration method of claim 24, wherein said source external to said integrated circuit comprises an external computer, a program for said calibration computer for measuring said registration errors and determining, in response thereto, said calibration data, and means for connecting said calibration to said integrated circuit.

26. The calibration method of claim 25, further comprising the step of reading said memory means with said calibration computer to ascertain the current calibration.

27. The calibration method of claim 25, wherein said memory means comprises a non-volatile permanent memory and a second volatile memory, and further comprising the steps of providing said calibration data to said volatile memory, iteratively repeating the steps of measuring said registration errors, estimating said calibration correction, providing said calibration data to said volatile memory, and controlling said transistors in accordance with said calibration data to reduce said registration errors until said registration errors are within an acceptable tolerance and thereafter transferring a final calibration data to said non-volatile memory.

28. The calibration method of claim 27, wherein said method is preferred automatically by said calibration computer.

29. The calibration method of claim 27, wherein said method is preferred semi-automatically, with said calibration computer being utilized to provide said calibration data to said memory means.

30. The calibration system of claim 6, wherein said computer means is external to said electricity meters, and further comprising means for connecting said computer means to said memory means for transmitting said calibration data to said memory means for storage therein.

31. The calibration system of claim 6, wherein said memory means comprises a non-volatile permanent memory and a second volatile memory, and further comprising:
  means for providing said calibration data to said volatile memory,
  means for utilizing said calibration data in said volatile memory for an iterative calibration operation with said computer means until final calibration data is obtained corresponding to a desired final calibration, and
  means for transferring said final calibration data to said non-volatile memory for permanent storage.

32. The calibration system of claim 31, wherein said utilizing means comprises a mulitplexer means for establishing a signal flow path from said switch means and, selectively, one of said non-volatile memory of said volatile memory.

* * * * *